United States Patent [19]

Stone

[11] 4,135,153
[45] Jan. 16, 1979

[54] CIRCUIT FOR TESTING HIGH FREQUENCY CURRENT AMPLIFYING CAPABILITY OF BIPOLAR TRANSISTORS

[75] Inventor: Dennis C. Stone, Roselle, Ill.

[73] Assignee: Dynascan Corporation, Chicago, Ill.

[21] Appl. No.: 792,134

[22] Filed: Apr. 29, 1977

[51] Int. Cl.$^2$ .......................................... G01R 31/22
[52] U.S. Cl. ................................................ 324/158 T
[58] Field of Search .............. 324/158 T, 158 D, 73 R

[56] References Cited

U.S. PATENT DOCUMENTS

| 3,350,641 | 10/1967 | Lubkin et al. | 324/158 T |
| 3,622,883 | 11/1971 | Haire | 324/158 T |

Primary Examiner—Rudolph V. Rolinec
Assistant Examiner—Ernest F. Karlsen
Attorney, Agent, or Firm—Wallenstein, Spangenberg, Hattis & Strampel

[57] ABSTRACT

A transistor test circuit provides for the selection of preferably three widely differing test frequencies for testing transistors normally having respectively relatively small, intermediate and large frequency gain-bandwidth product characteristics. These test frequencies are each much greater than the assumed normal cut-off frequency of the transistors to be tested thereby, and preferably only a fraction of the frequency at which the current gain of normal transistors would decrease to one. The test circuit is designed to form a linear amplifier circuit with the transistor under test and is provided with an automatic base drive control circuit which provides a substantially fixed predetermined DC collector current, despite wide variations in the current gain between different transistors being tested. The circuit further includes an indicating means for displaying the product of the selected test frequency and the current gain of the transistor under test, as indicated by the amplitude of the amplified test frequency signal in the collector circuit of the transistor under test.

18 Claims, 5 Drawing Figures

CIRCUIT FOR TESTING HIGH FREQUENCY CURRENT AMPLIFYING CAPABILITY OF BIPOLAR TRANSISTORS

BACKGROUND OF INVENTION

The invention relates to equipment for measuring the high frequency current amplifying capability of bipolar transistors, which generally is a function of both the magnitude of the gain obtainable in the relatively low frequency range and the bandwidth or cut-off frequency, $f_c$, thereof, which is the frequency at which the current gain drops 3dB from, or is 0.707 of, its generally constant maximum low frequency gain value. The most preferred form of the present invention provides test equipment for television and CB radio servicemen and others, to determine what is referred to as the f-tau ($f_t$) of bipolar transistors, which is the frequency at which current gain drops to a value of one. This frequency $f_t$ is mathematically equal to the product of the low frequency gain and $f_c$ or bandwidth of the bipolar transistors under test.

Manufacturers list the high frequency capability of its transistors in terms of the $f_t$ value thereof. It has been determined mathematically that where the test frequency is much greater than $f_c$ (that is at least about three times greater than $f_c$) $f_t$ is equal to the product of the test frequency and the gain at that test frequency. Transistor manufacturers have measured $f_t$ with test equipment which computes the product of such a test frequency and the gain of the transistor under test, but this test equipment is not easily useable with transistors of widely different types and is so sophisticated that servicemen cannot afford the same. Thus, such servicemen have not heretofore been able to test the $f_t$ (or gain-bandwidth product) of transistors. There are many instances when it would be helpful for servicemen to be able to test the $f_t$ of transistors. For example, most test equipment used by these servicemen measures the gain of transistors at relatively low frequencies, that is frequencies well below the frequency $f_c$. If a transistor which is tested passes this gain test, and still the CB, television or other circuit involved does not operate properly, the serviceman has no way of knowing if the problem is due to a transistor which does not produce adequate gain at and well above the cut-off frequency. Additionally, there are many instances when the serviceman desires to know if he can substitute a high frequency transistor of one type, which may be a Japanese made transistor, with no well known replacement type of U.S. manufacture, with another transistor of a different type without a time consuming physical substitution of the latter transistor for the former transistor. It would, therefore, be extremely useful if servicemen could have modestly priced test equipment which could immediately give an indication of the high frequency capability of a substitute transistor by a quick out-of-circuit measurement.

One factor complicating the design of gain-bandwidth product measuring equipment useful to television and CB radio servicemen is that, unlike the test equipment used by transistor manufacturers where a particular piece of test equipment is set-up to test only one type of transistor, the test equipment for television and CB radio servicemen must be quickly and easily adaptable for testing transistors of a wide variety of types. The gain of transistors is generally tested under conditions where the transistor operates as a linear amplifier, and so the base-emitter circuit of a tested transistor includes a DC bias for producing a DC collector current which is varied in positive and negative going directions by the signal to be amplified applied to the base-emitter circuit thereof. Transistors of widely different types frequently produce a different DC collector current for a given DC bias applied to the base-emitter circuit thereof. Unfortunately, the current gain of transistors varies appreciably with the DC collector bias current, particularly at frequencies exceeding the cut-off frequency thereof. Therefore, the costly test circuits of the type heretofore utilized by transistor manufacturers are unsuitable for measuring the $f_t$ of transistors of different types which produce widely different DC collector current for a given base-emitter bias because either the DC base-emitter biasing voltages thereof are not readily adjustable, or, if adjustable, require the servicemen to make an adjustment thereof as different transistors are tested, which unduly complicates the measuring procedure.

It is, accordingly, one of the main objects of the invention to provide relatively inexpensive yet reliable and easy to use equipment for testing the $f_t$ or the gain-bandwidth product of bipolar transistors of a wide variety of types.

SUMMARY OF THE INVENTION

The test equipment of the present invention, like the aforesaid test equipment used by transistor manufacturers, measures $f_t$ by indicating the product of a test frequency much greater than $f_c$ and the high frequency current gain of the transistor under test at that frequency. In accordance with one of the features of the present invention, the test equipment accurately measures the gain-bandwidth product of transistors of widely different types and frequency response characteristics and requiring different base-emitter DC bias to produce a standard DC collector current, without the need for any DC bias adjusting procedure. The test equipment of the invention preferably provides for a selection of at least two and preferably three test frequencies, each of which is much greater (i.e. that is at least about three times greater) than the cut-off frequency of the transistors to be tested therewith (so that $f_t$ is approximately equal to the product of the test frequency times the high frequency current gain at such frequency). The test frequencies are preferably only a fraction of the maximum expected $f_t$ of the transistors to be tested therewith, so that the gain of the transistor under test is at least about two and preferably at least about five at the test frequency. The test circuit forms with the transistor under test a linear amplifier circuit. Of utmost importance is the fact that the test circuit is uniquely provided with a bias control circuit coupled to collector and base connecting terminals to which the collector and base of the transistor under test is connected which automatically adjusts the base drive current of the transistor under test to provide a fixed predetermined DC collector current, independently of the type of transistor being tested. Thus, the test circuit is useable with transistors of widely different types which would normally produce widely different DC collector currents under fixed base-emitter biasing conditions, without the need for any operator adjustments.

In the most preferred form of the invention, the indicating means includes a meter movement with a pointer which moves over a number of scales calibrated preferably to indicate $f_t$ directly for the various pointer deflections produced by the different test frequencies under various current gain conditions. A test frequency selection switch is provided which automatically selects the test frequency and varies the resistance in series with the meter movement so that the meter movement deflection indicates the product of the test frequency and the amplitude of the test frequency component of the collector current in the collector circuit of the transistor under test.

The above and other objects, advantages, and features of the invention will become apparent upon making reference to the specification to follow the claims and the drawings.

DESCRIPTION OF PREFERRED FORM OF THE INVENTION

Figure 1:
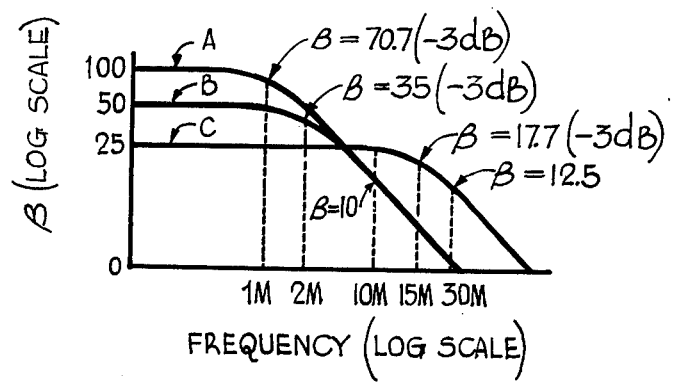
FIG. 1 shows a series of curves showing the current gain versus frequency characteristics of three widely different transistors.

Reference should be made to FIG. 1 which shows three different bipolar transistor current gain versus frequency curves A, B and C. It is typical of transistors that the current gain thereof is constant from a DC or zero frequency level to a given frequency where the gain begins to drop off, until it reaches a frequency where the gain is 0.707 times (or 3dB) lower than said constant current gain. The latter frequency is the cut-off frequency of the transistor and defines the bandwidth of the transistor. (The flat part of the gain curve is sometimes referred to as the low frequency current gain portion thereof.) It should be noted that the low frequency current gain curve B is less than that of curve A, curve A has a lower cut-off frequency than curve B, and that while curve A has a lower cut-off frequency than curve B, the $f_t$ (the frequency where current gain reduces to one) of the transistors producing curves A and B are the same. The curves also illustrate the known and interesting fact that at frequencies above the cut-off frequency, the current gain is cut in half each time the frequency is doubled. If the test frequency is about at least three times greater than the cut-off frequency of a transistor, it can mathematically be shown that the following equations apply:

$$f_t = B \times f = Bo \times f_c$$

where:
B = current gain at the test frequency (f)
Bo = low frequency current gain
$f_c$ = the cut-off frequency The formula shows that $f_t$ and the gain-bandwidth product of a transistor (Bo × $f_c$) is equal to the product of the current gain and any test frequency substantially in excess of the cut-off frequency. Thus, a practical method for measuring $f_t$ is to measure the current gain at any test frequency much greater than the cut-off frequency, and then multiply the current gain times the test frequency in megahertz. This method of measuring the gain-bandwidth product or $f_t$ is utilized in the present invention.

Figure 2:
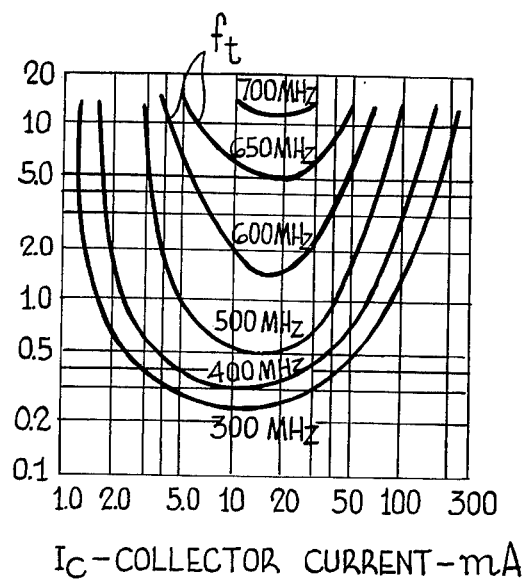
FIG. 2 shows a series of constant $f_t$ curves each showing the variation of the DC collector-emitter voltage with collector current.

Refer now to FIG. 2 which illustrates one of the problems overcome by the test circuit of the present invention, namely that $f_t$ varies with DC transistor collector current, so that the comparison of the gains of two transistors having different collector currents is an erroneous comparison and introduces errors in the determination of $f_t$ unless the DC collector current is maintained constant. The present invention, however, overcomes this problem without placing any procedural burdens on the operator even when measuring $f_t$ of a wide variety of transistors which, under normal circumstances, would produce a different DC collector current with the same emitter to base bias conditions.

Figure 3:
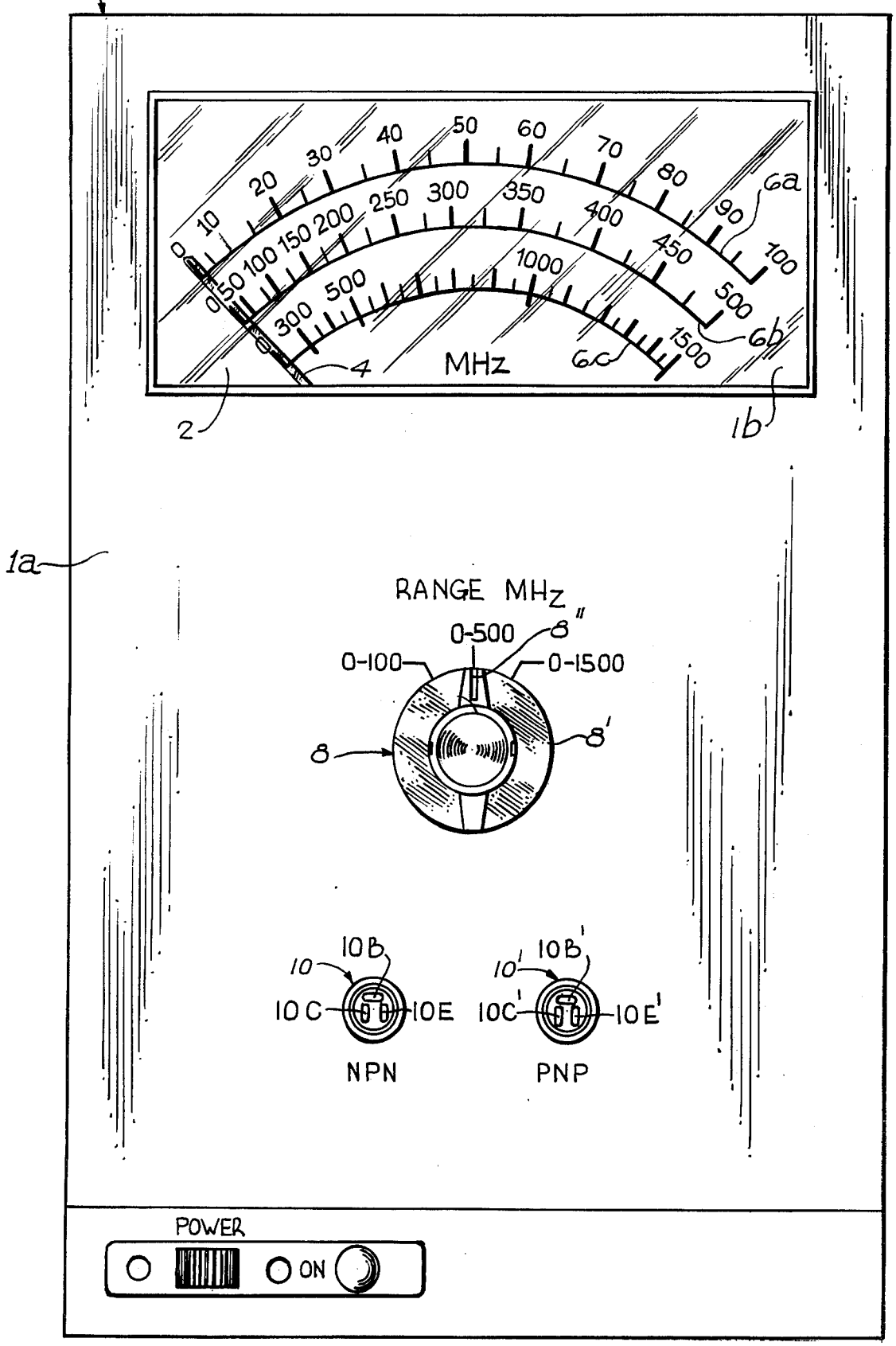
FIG. 3 is a view of the control and indicating panel of test equipment constituting the most preferred form of the present invention.

Refer now to FIG. 3 which shows the indicating and control panel 1a on the front of a housing 1 containing the different components making up the exemplary test circuit of the present invention. (The housing 1 may include also, other transistor test equipment with additional controls and meters commonly used by television, CB radio and high fidelity sound equipment servicemen.) Visible through a window 1b on the panel 1a is the indicating face 2 of a meter movement which controls the pivoting of a pointer 4 over a series of scales 6a, 6b and 6c falling along a circle concentric with the pivot axis of the pointer 4. The uppermost scale 6a is calibrated with numbers extending from 0 to 100 representing $f_t$ values in the range of from 0 through 100 MHz. The middle scale 6b is calibrated with numbers of from 0 to 500 representing $f_t$ values in the range of from 0 to 500 MHz, and the bottommost scale 6c is calibrated in numbers from 0 to 1500 representing $f_t$ values in the range of from 0 to 1500 MHz. As is the case with most test instruments, readings obtained in the lower regions of the meter movement scales involved are relatively inaccurate, and so the meter range selected is the highest meter range producing an indication in excess of certain designated values on the scales involved. In the actual commercial equipment involved, the minimum pointer deflections which must be reached for reasonable accuracy on the scales 6a, 6b and 6c represent frequencies respectively of 5, 50 and 300 MHz. A three-position test frequency selector switch 8 is provided which, as illustrated, includes a rotatable control knob 8' having a nose portion 8" positionable opposite indicia indicating $f_t$ ranges of 0 to 100 MHz, 0 to 500 MHz and 0 to 1500 MHz. Three terminal sockets 10 and 10' are mounted on the housing panel for insertion of the leads of NPN and PNP transistors respectively. The terminals 10B-10C-10E and 10B'-10C'-10E' of these sockets are respectively for insertion of the base, collector and emitter leads of the transistors under test, which must be removed from any external circuitry to perform the out-of-circuit $f_t$ test involved. If the serviceman is not certain as to whether the transistor under test has a low, intermediate or high $f_t$, he adjusts the selection switch 8 to the highest range. If the pointer position exceeds the given designated minimum meter deflection of 300 MHz, then the $f_t$ frequency is indicated by the pointer 4 on the scale 6c. If it does not, the selector switch 8 is moved to the intermediate range. If the meter deflection still does not exceed the minimum meter deflection of 50 MHz, the selection switch 8 is moved to the lowest range. (It should be noted that since $f_t$ represents the product of the test frequency and the current gain of the transistor under test, and since the test frequencies to be described utilized in the instruments over the three ranges referred to are respectively 1, 10 and 30 MHz, these minimum useable pointer deflections are present for gain values respectively of 5 on the lowest range, 5 on the intermediate range and 10 on the uppermost range.)

Figure 4:
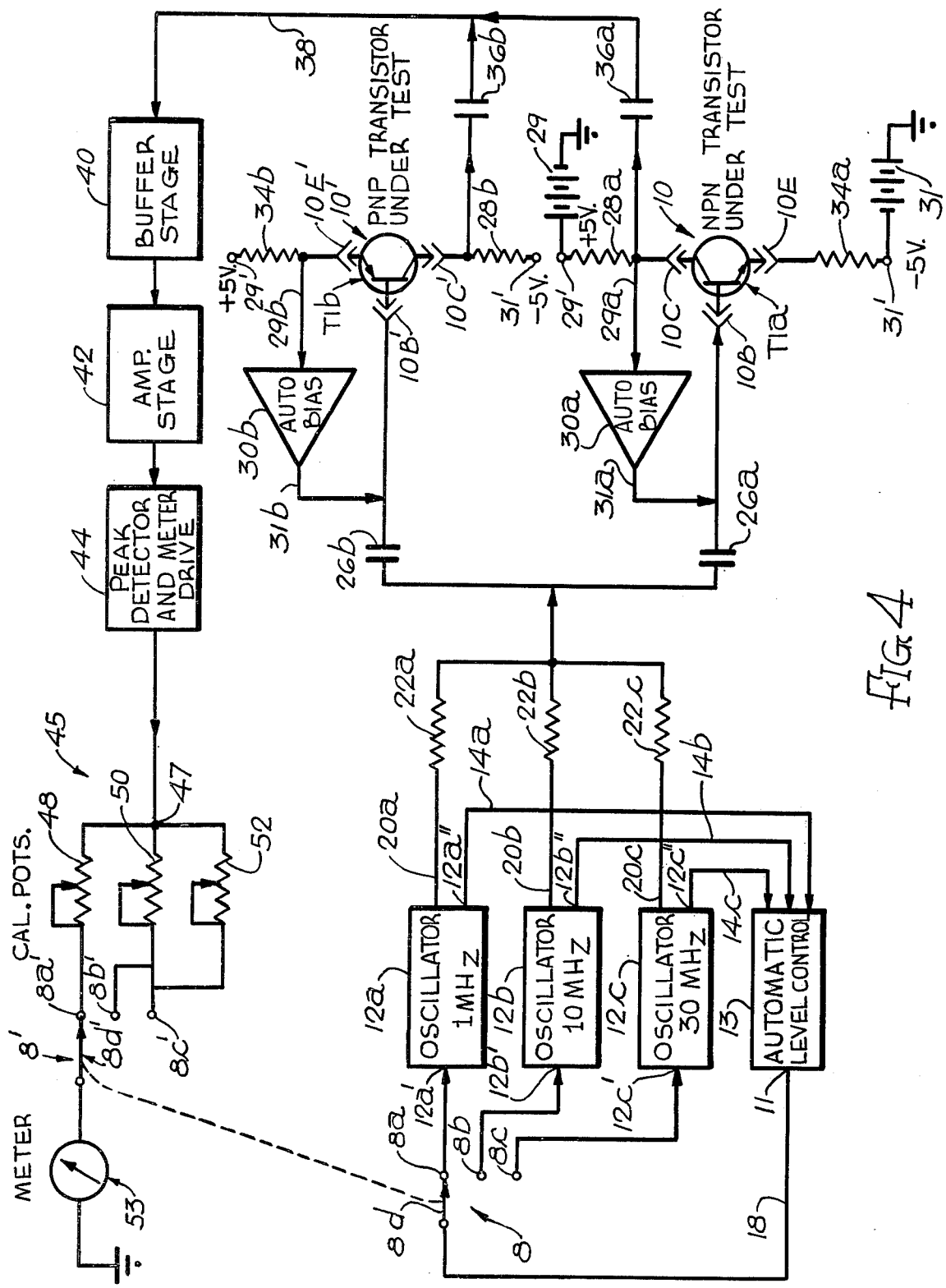
FIG. 4 is a block diagram of the circuitry utilizied in the most preferred form of the invention.

Refer now to FIG. 4 which shows a block diagram of the most preferred form of test circuit of the present invention. The selection switch 8 in FIG. 4 is shown as including a wiper 8d adapted to make selective engagement with stationary contacts 8a, 8b or 8c. Wiper 8d is shown connected by a line to the output 11 of an automatic level control circuit 13 which applies a DC energizing voltage to a selected oscillator circuit 12a, 12b or 12c. The stationary contacts 8a, 8b and 8c are respectively connected to the energizing voltage input terminals 12a', 12b' and 12c' of the oscillator circuits 12a, 12b and 12c respectively tuned to produce test frequency signals of 1, 10 and 30 MHz of a magnitude depending on the magnitude of the energizing voltage fed thereto. The oscillator circuits 12a, 12b and 12c have outputs 12a'', 12b'' and 12c'' connected by lines 14a, 14b and 14c to the input of the automatic level control circuit 13 which responds to the magnitude of the selected oscillator output by developing a DC voltage which stabilizes the oscillator output at a fixed predetermined value. The oscillator circuits 12a, 12b and 12c have output terminals connected respectively by lines 20a, 20b and 20c to a common signal input terminal coupled through capacitors 26a and 26b respectively to the base connecting terminals 10B and 10B' of the sockets 10 and 10'.

The collector connecting terminal 10C is connected through a resistor 28a to the +5 volt terminal 29' of a source 29 of DC energizing voltage whose negative terminal is grounded. The emitter connecting terminal 10E is shown coupled through a resistor 34a to the −5 volt terminal 31' of a source 31 of DC energizing voltage whose positive terminal is grounded. Similarly, the collector connecting terminal 10C' is coupled through a resistor 28b to the negative terminal 31' and emitter connecting terminal 10E' is coupled through a resistor 34b to the positive terminal 29', respectively. The DC collector current of any transistor under test is fixed preferably at 10 milliamps by a bias control circuit 30a connected between the collector and base connecting terminals 10C and 10B for a NPN transistor under test, and by a similar bias control circuit 30b connected between the emitter and base terminals 10E' and 10B for a PNP transistor under test. The biasing conditions so established form linear amplifier circuits with the transistor under test. The amplified AC test frequency component of the collector current of an NPN or PNP transistor under test connected to the proper terminals of socket 10 or 10' is coupled respectively through capacitor 36a or 36b to a common line 38 leading to a buffer amplifier stage 40. This buffer amplifier stage 40 forms a cascode-like circuit with the transistor under test in a manner which effectively produces the equivalent of an AC short circuit between the collector and emitter terminals of the transistor under test in a manner to be explained. This is done for the purpose of eliminating the negative effects of the interlead capacitance on the amplifying capability of the transistor. The output of the buffer amplifier stage 40 is coupled to another amplifier stage 42, in turn, coupled to a peak detector and the meter drive circuit 44. Among other things, this circuit 44 rectifies the AC signal output of the amplifier stage 42 and produces a DC voltage proportional to the peak value of the amplified signal, which DC voltage is coupled to the input of the meter circuit 45. The meter circuit 45 includes three calibrating potentiometers 48, 50 and 52 connected as rheostats between a common input terminal 47 and respective stationary contacts 8a', 8b' and 8c' of a second section 8' of the selector switch 8 to which it is ganged for joint operation. The switch section 8' has a wiper 8d'' coupled for operation with the wiper 8d of selector switch 8. The wiper 8d'' is coupled to one terminal of a meter movement 53 whose other terminal is grounded. Thus, as the 1, 10 and 30 MHz test frequency oscillator circuits 12a, 12b and 12c are respectively rendered sequentially operable, calibration potentiometers 48, 50 and 52 are correspondingly connected in series with the meter movement 53. The calibration potentiometers 48, 50 and 52 are adjusted so that for test transistor current gains of 100, 50 and 50, respectively, the meter movement pointer 4 will be at the full scale deflection points on the meter scales 6a, 6b and 6c, indicating $f_t$ values of 100, 500 and 1500 MHz respectively in the exemplary test circuit being described.

It should be noted that many aspects of the circuit design shown in FIG. 4 contribute to the relatively low cost of manufacture of this test equipment. In the first place, the highest frequency utilized, namely the test frequency of 30 MHz, is of a fairly modest level, to minimize the expense and criticality of the circuit design involved. Also, the test frequencies are selected so that they are substantially lower (as by a fraction of 2 or more) from the $f_t$ of the transistors to be tested by the test frequency involved, so that the current gain produced by the transistor under test measured in the useful portion of the scales involved result in a current gain of at least about 2, and preferably at least about 5, thereby assuring certain minimum signal levels present in the various stages of the test circuit. Also, since the method of determining gain-bandwidth product involves the use of fixed predetermined frequencies, the various circuits can be designed for similar optimum performance at the three selected test frequencies, even though such performance is not present between those frequencies.

Figure 5:
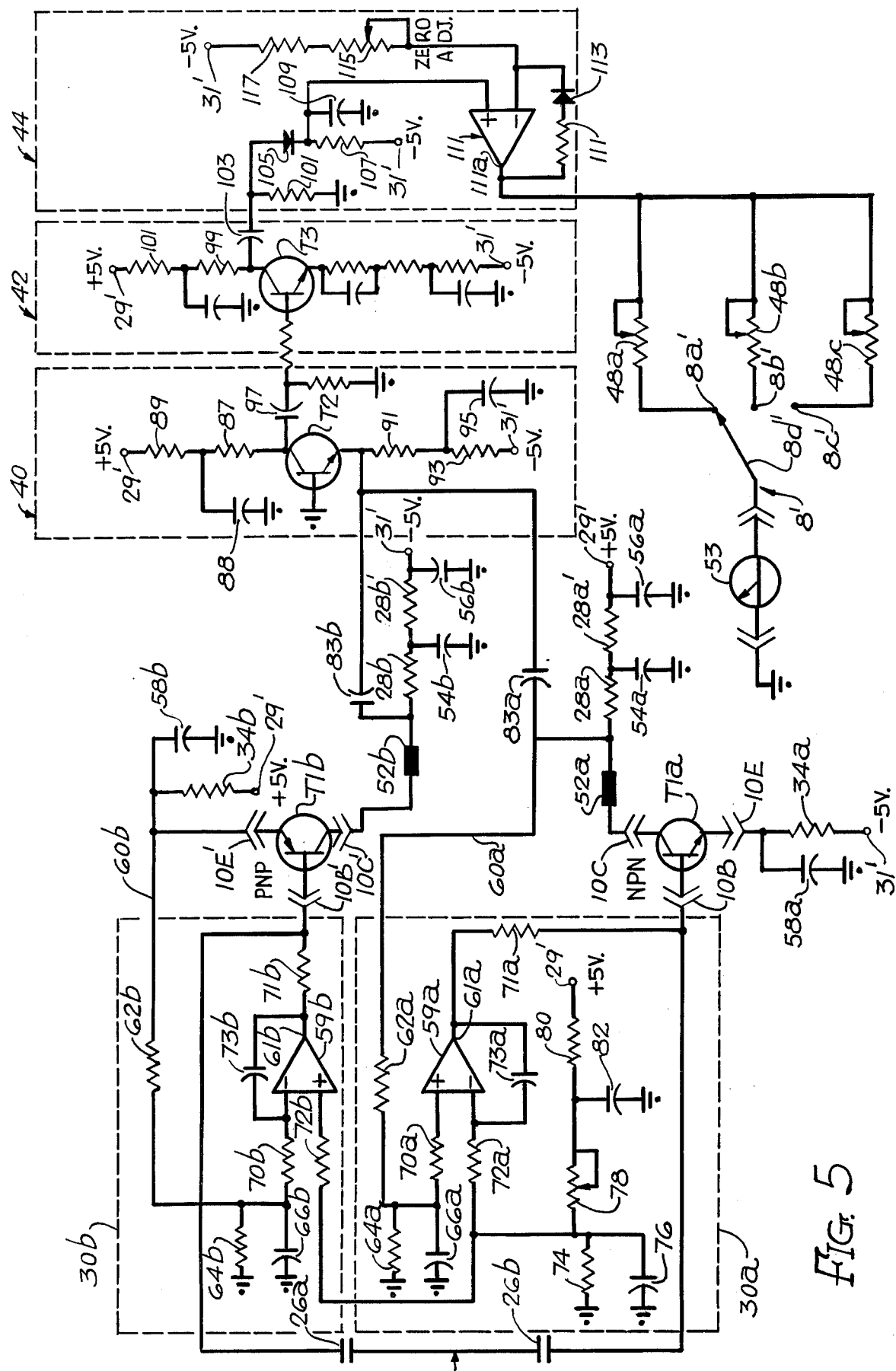
FIG. 5 shows exemplary circuitry for most of the block diagram shown in FIG. 4.

Refer now more particularly to the circuit diagram of FIG. 5 which illustrates the preferred circuitry for the various boxes shown in the block diagram of FIG. 4 coupled to the oscillator circuits. (This circuit diagram omits the oscillator circuits 12a, 12b and 12c and the related automatic level control circuit since it is obviously old and well known in the art to provide frequencies of a selection of values at a predetermined designated controlled amplitude level.) As shown in FIG. 5, ferrite beads 52a-52b are respectively connected between the collector connecting terminals 10C-10C' and series connected collector circuit resistors 28a-28a' and 28b-28b', in turn, connected respectively to supply terminals 29'-31'. High frequency bypass filter capacitors 54a-54b are shown connected between the juncture of the resistor pairs 28a-28a' and 28b-28b' and ground, and low frequency bypass filter capacitors 56a-56b are shown connected between the DC supply terminals 29'-31' and ground. The emitter connecting terminals 10E and 10E' are coupled by resistors 34a-34b respectively to the negative and positive supply terminals 31'-29'. High frequency bypass capacitors 58a-58b are also shown connected between the emitter sides of the resistors 34a-34b and ground.

The automatic bias control circuits 30a and 30b shown in FIG. 5 include operational amplifiers 59a and 59b, respectively. The circuits associated with these operational amplifiers include series connected resistor pairs 62a—64a and 62b—64b respectively connected between the collector side of the resistor 28a and the emitter side of resistor 34b and ground. Filter capacitors 66a-66b are respectively connected across the resistors 64a-64b to establish a DC voltage of a proportionate value to the positive DC voltage present at the collector and emitter of respectively of a NPN transistor T1a and PNP transistor T1b under test. As the DC collector current of the transistors T1a or T1b increase or decrease, the magnitude of the DC voltages respectively at the collector and emitter thereof vary in the opposite direction. The positive voltage appearing on the resistor 64a is coupled through a resistor 70a to the positive input terminal of the operational amplifier 59a. The positive voltage appearing across the resistor 64b is coupled through a resistor 70b to the negative input terminal of the operational amplifier 59b. Oscillation inhibiting feedback capacitors 73a-73b are respectively connected between the output terminals 61a-61b of the operational amplifiers 59a-59b and the negative input terminals thereof. The output terminals 61a-61b are coupled through resistors 71a and 71b respectively to the base connecting terminals 10B and 10B'. The negative input terminal of the operational amplifier 59b is coupled through resistor 72a and resistor 74 to ground, and the positive input terminal of the operational amplifier 59b is coupled through resistor 72b and the resistor 74 to ground. A filter capacitor 76 is coupled across the resistor 74. The ungrounded end of resistor 74 is coupled throuh an automatic bias control adjusting resistor 78 and a resistor 80 to the +5 volt terminal 29' of the voltage supply 29'. There is thus coupled a reference positive voltage to the negative input terminal of the operational amplifier 59a and to the positive terminal of the operational amplifier 59b.

It is well known with operational amplifiers of the kind described, that when the positive input terminal thereof is positive relative to the voltage applied to the negative input terminal, the operational amplifier produces an amplified output of a positive polarity and value proportional to the difference between the two voltages on the input terminals thereof, and when the positive terminal is negative with respect to the negative input terminal, the operational amplifier produces an output of a negative polarity and value proportional to the difference between the voltages on the input terminals. The manufacturer of the test equipment being described places, for example, a NPN transistor in socket 10, and the automatic bias control resistor 78 is adjusted to produce a DC voltage at the collector of transistor T1a indicative of a desired DC collector current, like 10 milliamps. The operational amplifier 59a produces a finite positive output fed to the base connecting terminal 10B for NPN transistor T1a. If any subsequent placement of a transistor in the proper socket 10 or 10' would result in a tendency for the DC collector current thereof to increase or decrease from 10 milliamps, this change is opposed and cancelled by the change in the output of the operational amplifier 59a or 59b coupled through said resistors 71a-71b to the base connecting terminals 10B and 10B' because the operational amplifiers 59a and 59b and associated resistors are selected to produce the same DC collector current in NPN and PNP transistors, respectively.

Thus, if the operational amplifier circuits just described are traced, it will be seen, for example, that any increase in DC collector current of NPN test transistor T1a will result in a decrease in the positive voltage fed to the positive input terminal of the operational amplifier 59a, resulting in a decreased positive voltage output of the operational amplifier which, when fed to the base of the NPN transistor T1a, will oppose and cancel out this collector current increase. Similarly, an increase in the flow of emitter-collector circuit current in the transistor T1b will result in a decrease in the positive voltage appearing on the emitter thereof coupled to the negative input terminal of operational amplifier 59b, which will result in a less negative voltage appearing at the output terminal 61b of the operational amplifier 59b which, when fed to the base of PNP transistor T1b, will oppose and cancel this collector current increase. Obviously, a decrease in collector current in the transistors T1a or T1b will result in the inverse of the operation of the circuit just described.

The purpose of the ferrite beads 59a and 59b connected to the collector connecting terminals 10C and 10C' is to prevent spurious oscillations developing in the circuits involved, especially at the higher frequency of 30 MHz.

As previously indicated, an industry definition of $f_t$ pre-supposes that there is an effective zero AC impedance between the emitter and collector of the transistor under test. The present test circuit is uniquely designed to provide an equivalent short circuit between the emitter and collector of the transistor under test. The aforementioned buffer stage 40 performs this function. The buffer stage illustrated includes a NPN transistor T2, the collector of which is connected through resistors 87 and 89 to the positive supply terminal 29', the emitter of which is connected through resistors 91 and 93 to the negative supply terminal 31', and the base of which is grounded. A bypass capacitor 95 is connected to the juncture of resistors 91-93 and ground and a bypass capacitor 88 is connected between the juncture of resistors 87-89 and ground. Coupling capacitors 83a-83b respectively extend from the collector sides of the resistors 28a-28b to the emitter of transistor T2. The output of the buffer stage 40 is taken on the collector side of resistor 87 where the voltage thereat is coupled through capacitor 97 to a more or less conventional amplifier stage 42, most of the details of which will not be described.

Because the base of the transistor T2 is grounded, it will act in a manner to maintain the voltage on its emitter at a constant value, which means that the current flowing through the resistors 91-93 will be maintained constant by the transistor circuit now being described. Therefore, the effective input impedance at the emitter of transistor T2 is very small in comparison to the resistance of collector circuit resistors 28a-28a' or 28b-28b' of the transistor T1a or T1b under test. For example, considering the AC component of the current flowing in the collector circuit of the transistor under test, only a small fraction, like 10%, of this current flows through the collector circuit resistors 28a-28a' or 28b-28b', while practically all of this AC component of collector current of the transistor under test flows into the cascode circuit of the transistor T2. Thus, while there are substantial current fluctuations in the collector current of the transistor under test, there is practically little or no fluctuation in the voltage on the collector of the transistor under test, which is a condition which is the equivalent of an AC signal short circuit between the collector and emitter of the transistor under test.

Amplifier stage 42 includes a NPN transistor T3 and associated impedances forming a linear amplifier circuit. As shown, resistors 99 and 101 are connected in series between the collector and the positive supply terminal 29'. A coupling capacitor 103 couples the voltage at the collector of the transistor T3 to the peak detector and meter drive circuit 44. As shown, the peak detector and meter drive circuit 44 includes a resistor 101 coupled between the capacitor 103 and ground, and a rectifier 105 connected between the juncture of resistor 101 and capacitor 103 and a resistor 107 extending to the negative supply terminal 31'. The rectifier 105 is shown oriented in a way which passes positive voltages and blocks negative voltages on the ungrounded side of resistor 101. A peak voltage charging capacitor 109 is connected between the juncture of rectifier 105 and resistor 107 and ground.

Without any signal output of the amplifier stage 42, the peak detector circuit will be in a condition determined solely by the voltage introduced therein by the DC voltage supplied from the negative supply terminal 31' to the circuit comprising resistor 101, rectifier 105 and resistor 107. When the rectifier 105 is a silicon rectifier, a 0.6 volt drop occurs across this rectifier, and the voltage between the juncture of rectifier 105 and capacitor 109 and ground to which the capacitor 109 will be charged will be a negative voltage with respect to ground, as, for example, −1 volt. The negative voltage on capacitor 109 is coupled to the positive input terminal of an operational amplifier 111 which has a gain of 1. When the amplifier stage 42 receives a signal which is amplified thereby, the positive going portion of the output signal of this amplifier stage will cause the juncture between rectifier 105 and resistor 101 previously at a given negative voltage, like −0.4 volts to become less negative, which will cause an increase in current flow through the circuit to charge the capacitor 109 in a positive going direction, so that the charge in capacitor 109 will be less negative, such as −0.9 volts instead of the −1 volts. Once the capacitor 109 is charged by the positive going portion of the output from amplifier stage 42, the capacitor 109 holds this charge during the negative going portion of this output.

In the absence of any signal output of the amplifier stage 42, the negative input terminal of the operational amplifier 111 will be at the same negative voltage as the positive input terminal thereof, such as the −1 value volt exemplary. The −1 volt on this negative input terminal is achieved by a biasing circuit which extends from the negative supply terminal 31' through resistor 117 and a zero adjusting potentiometer 115. The resistors 117 and 115 together match the aforementioned resistor 107. Connected between the negative input terminal of the operational amplifier 111 and the output terminal 111a thereof is a feedback circuit comprising a rectifier 113 and a resistor 111 which match the rectifier 105 and the resistor 106. The voltage on the output terminal 111a of the operational amplifier is adjusted precisely to ground potential by adjusting the zero adjusting potentiometer 115, so that the circuit is balanced to give accurate peak detector readings for any transistor when an output signal appears at the amplifier stage 42. As previously described, when the capacitor 109 is charged to its minimum negative value by the maximum positive going portion of the output of amplifier stage 42, the resultant lowered negative voltage at the positive input terminal of the operational amplifier 111 makes this terminal positive relative to the negative input terminal of the operational amplifier 111, which results in a similar positive voltage at the output terminal 111a with respect to ground (since the operational amplifier 111 has a gain of one). Thus, the operational amplifier is used as a comparison circuit to provide an output voltage of the proper polarity and value following the change in voltage on the capacitor 109. The voltage at the output terminal 111a is coupled to the meter circuit which responds thereto in a manner previously described in connection with the block diagram of FIG. 4.

It should be appreciated that the present invention provides an exceedingly reliable and relatively inexpensive test equipment useable with transistors of widely different types and current gains for giving a measure of the product of the test frequency and gain of the transistor under test preferably directing in terms of the $f_t$ value thereof and without any operator adjustments other than a range changing operation.

It should be understood that numerous modifications can be made in the preferred form of the invention described without deviating from the broader aspects of the invention.

I claim:

1. A transistor test circuit for testing the high frequency current amplifying capability of bipolar transistors having widely varying current gains and cut-off frequencies, said circuit comprising: emitter, collector and base connecting terminals to which the emitter, collector and base terminals of the transistors under test are respectively to be connected, means providing at a test signal input terminal a sinusoidal test frequency signal which has a frequency much greater than the assumed normal cut-off frequency of the transistors to be tested, a source of DC energizing voltage, test circuit means coupled between said source of DC energizing voltage and said emitter and collector connecting terminals and between said test signal input terminal and said emitter and base connecting terminals for producing an amplifier circuit which linearly amplifies the test frequency signal when the base circuit of the transistor under test is properly biased, said test circuit means including an automatic bias level control circuit connected between said emitter and base connecting terminals and responsive to the DC collector current of the transistor under test to automatically adjust the base drive current of the transistor under test to provide a substantially fixed predetermined DC collector current effecting linear amplification of said test frequency signal, and means for providing an indication of the product of the test frequency signal and the amplitude of the AC component of the collector current of the transistor under test.

2. The transistor test circuit of claim 1 wherein said test frequency signal frequency is much less than the frequency at which the gain of the transistor under test reduces to one, wherein the gain of the transistor under test will normally be at least about two.

3. The transistor test circuit of claim 2 wherein said test frequency signal frequency is selected so that the current gain of the transistors to be tested will normally be at least about five.

4. The transistor test circuit of claim 1 wherein there is provided means for effectively providing an AC short circuit across said emitter and collector connecting terminals.

5. The transistor test circuit of claim 1 wherein said amplifier circuit which linearly amplifies includes first impedance means in a circuit between said collector connecting terminal and said source of DC energizing voltage, and there is provided means for providing the equivalent of an AC short circuit across said emitter and collector connecting terminals comprising a circuit including a second transistor having its emitter and collector respectively coupled through emitter and collector circuit impedances to a source of DC energizing voltage and its base connected to a voltage reference point providing a fixed base-emitter current, means for coupling said collector connecting terminal for the transistor under test to the emitter connected side of said emitter circuit impedance, said first impedance means of the collector circuit of the transistor under test being a small fraction of the input impedance at the point where said coupling means couples said collector connecting terminal to the emitter circuit of the second transistor so that most of the AC component of collector current bypasses said first impedance means, and means for coupling the AC component of the voltage drop across the collector circuit impedance of said second transistor to said indication providing means.

6. A transistor test circuit for testing the high frequency current amplifying capability of bipolar transistors having widely varying current gains and cut-off frequencies, said circuit comprising: emitter, collector and base connecting terminals to which the emitter, collector and base terminals of the transistors under test are respectively to be connected, means providing at a test signal input terminal a selection of at least two sinusoidal test frequency signals, each of which is much greater than the assumed normal cut-off frequencies of the transistors to be tested, a source of DC energizing voltage, test circuit means coupled between said source of DC energizing voltage and said emitter and collector connecting terminals and between said test signal input terminal and said emitter and base connecting terminals for producing an amplifier circuit which linearly amplifies the test frequency signal when the base circuit of the transistor under test is properly biased to obtain linear amplifier action, said test circuit means including an automatic bias level control circuit connected between said emitter and base connecting terminals responsive to the DC collector current to automatically adjust the base drive current of the transistor under test to provide a substantially fixed predetermined DC collector current effecting said linear amplification of the test frequency signal, and means for providing an indication of the product of said selected test frequency signal and the amplitude of the AC component of the collector current of the transistor under test.

7. The transistor test circuit of claim 6 wherein there is provided means for effectively providing an AC short across said emitter and collector connecting terminals.

8. The transistor test circuit of claim 6 wherein said amplifier circuit which linearly amplifies includes first impedance means in a circuit between said collector connecting terminal and said source of DC energizing voltage, and there is provided means for providing the equivalent of an AC short circuit across said emitter and collector connecting terminals comprising a circuit including a second transistor having its emitter and collector respectively coupled through emitter and collector circuit impedances to a source of DC energizing voltage and its base connected to a voltage reference point providing a fixed base-emitter current, means for coupling said collector connecting terminal for the transistor under test to the emitter connected side of said emitter circuit impedance, said first impedance means of the collector circuit of the transistor under test being a small fraction of the input impedance at the point where said coupling means couples said collector connecting terminal to the emitter circuit of the second transistor so that most of the AC component of collector current bypasses said first impedance means, and means for coupling the AC component of the voltage drop across the collector circuit impedance of said second transistor to said indication providing means.

9. The transistor test circuit of claim 6 wherein said means for providing an indication includes meter movement means which moves pointer means over scale means in proportion to the current flowing therethrough, and calibration means comprising variable impedance means which varies the current in said meter movement in proportion to the selected test frequency.

10. The transistor test circuit of claim 9 wherein said meter movement means is a single meter movement having one pointer moving over a separate scale for each test frequency, each of said scales having indicia directly indicating the product of the current gain of the transistor under test and the test frequency represented by the various degrees of pointer movement.

11. The transistor test circuit of claim 6 wherein said indication providing means includes a single meter movement, and there is provided means responsive to the test frequency selected for controlling the amount of current flowing through the meter movement for a given test transistor gain depending upon the selected test frequency.

12. The transistor test circuit of claim 11 wherein said meter movement includes a pointer moving in response to the flow of current through the meter movement and a plurality of scales equal in number to the number of selectable test frequency signals over which the pointer moves, said plurality of scales being calibrated in accordance with the product of the frequency of the associated selected test frequency signal and the current gains corresponding to various deflection points of the pointer along the scales involved.

13. The transistor test circuit of claim 6 wherein said test frequency signal frequencies are only a fraction of the frequency at which the current gain of normal transistors to be tested thereby would decrease to 1.

14. The transistor test circuit of claim 6 wherein the uppermost of said test frequency signal frequencies is at least about 5 times greater than the lowermost of the same.

15. The transistor test circuit of claim 6 wherein said means providing at a test signal input terminal provides a selection of three test frequency signals, the ratio of the frequency of the intermediate to the lowermost of these test frequency signal frequencies being many times more than the ratio of the uppermost to the intermediate of these test frequency signal frequencies.

16. The transistor test circuit of claim 10 wherein said means providing at a test signal input terminal provides a selection of at least three test frequency signals of widely differing frequencies, and there are three of said scales over which said pointer moves.

17. The transistor test circuit of claim 16 wherein full scale pointer deflection on the scale used with the uppermost test frequency indicates a value in excess of about 1,000 MHz, on the scale used with the lowermost test frequency indicates a value substantially under 500

MHz, and on the scale used with the intermediate test frequency indicates a value substantially greater than full scale pointer deflection on the scale associated with the lowermost test frequency and substantially lower than the full scale pointer deflection on the scale associated with the uppermost test frequency.

18. The transistor test circuit of claim 5 wherein said means for coupling is a capacitor.

* * * * *